(12) United States Patent
Usuda

(10) Patent No.: US 6,500,735 B2
(45) Date of Patent: Dec. 31, 2002

(54) SEMICONDUCTOR DEVICE AND METHOD OF MANUFACTURING THE SAME

(75) Inventor: Koji Usuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/952,262

(22) Filed: Aug. 30, 2001

(65) Prior Publication Data

US 2002/0039831 A1 Apr. 4, 2002

(30) Foreign Application Priority Data

Sep. 29, 2000 (JP) .................................... 2000-300442

(51) Int. Cl.[7] .................... H01L 21/36; H01L 21/31; H01L 21/469
(52) U.S. Cl. ................... 438/479; 438/488; 438/778; 438/771; 438/772
(58) Field of Search .................. 438/479, 488, 438/491, 778, 779, 771, 772

(56) References Cited

U.S. PATENT DOCUMENTS

| | | | | |
|---|---|---|---|---|
| 4,999,314 A | * | 3/1991 | Pribat et al. | 437/89 |
| 5,277,748 A | * | 1/1994 | Sakaguchi et al. | 156/630 |
| 5,641,694 A | * | 6/1997 | Kenney | 438/156 |
| 5,827,772 A | * | 10/1998 | Nakamura et al. | 438/486 |
| 6,329,703 B1 | * | 12/2001 | Schrems et al. | 257/636 |

OTHER PUBLICATIONS

K. Usuda, et al., "Atomic force microscopy observations of $SiO_2$/Si interface prepared by radical oxygen process", ISSS–3, PS–2–58, Nov. 29, 1999, p. 174.

U.S. patent application Ser. No. 09/717,039, filed Nov. 22, 2000, pending.

U.S. patent application Ser. No. 09/952,262, filed Aug. 30, 2001, pending.

* cited by examiner

*Primary Examiner*—Alexander Ghyka
(74) *Attorney, Agent, or Firm*—Oblon, Spivak, McClelland, Maier & Neustadt, P.C.

(57) ABSTRACT

There is disclosed a method of manufacturing a semiconductor device, wherein a semiconductor layer having an acute projection containing polycrystalline silicon is formed on a substrate, and then, an insulating layer is formed on the semiconductor layer through an oxidation of the semiconductor layer by excited oxygen species in such a manner that a radius of curvature of the acute projection of the semiconductor layer becomes 20 nm or more.

15 Claims, 3 Drawing Sheets

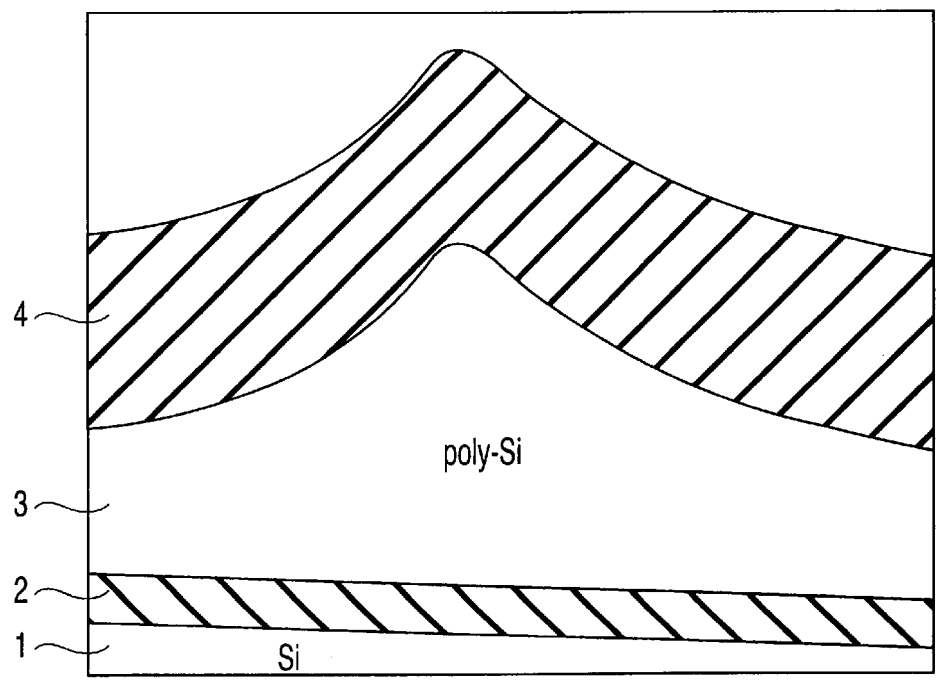
F I G. 2
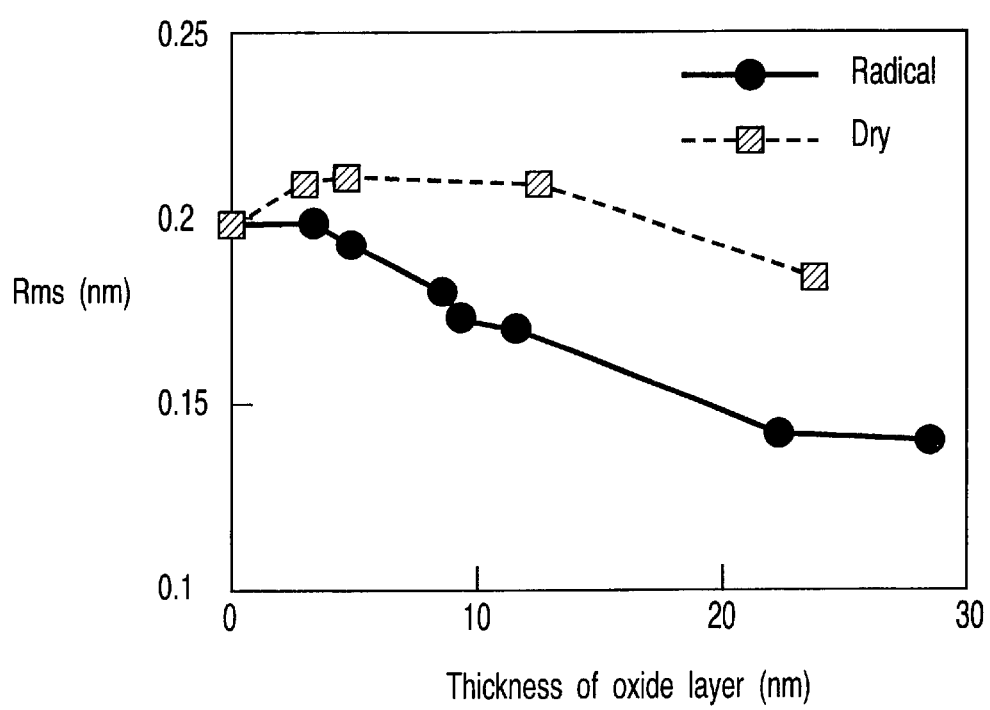
F I G. 3

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2000-300442, filed on Sep. 29, 2000, the entire contents of which are incorporated by reference.

BACKGROUND OF THE INVENTION

1. Field of the Invention

This invention relates to a method of manufacturing a semiconductor device and also to a semiconductor device, in particular, a semiconductor device wherein an insulating film is directly formed on a layer of semiconductor device comprising polycrystalline silicon.

2. Description of the Related Art

A polycrystalline silicon layer which is directly deposited on a Si substrate by a CVD method, or which is formed through the heating of an amorphous layer or a polycrystalline layer that has been formed in advance is sometimes accompanied on the surface thereof with fine recessed/projected portions of the order of nanometers or more in roughness. When a conventional Si semiconductor element, in particular, an MOSFET transistor is manufactured by a polycrystalline silicon having such fine recessed/projected portions, the performance of the resultant element may sometimes deteriorated due to an influence from the configuration of interface, i.e. the aforementioned fine recessed/projected portions, between a layer of the polycrystalline silicon and an oxide film formed on the polycrystalline silicon layer. One of the main causes for this deterioration is a breakdown of insulating layer.

The MOSFET transistor is actuated by impressing an electric voltage between a metal electrode formed on an insulating layer and a polycrystalline silicon layer functioning as an active layer through the insulating layer. Therefore, if fine recessed/projected portions are existed at the interface between the polycrystalline silicon layer and the insulating film, a concentration of electric field is caused to locally generate at the interface, thus increasing the possibility of inviting the breakdown of insulating film, i.e. the breakdown of the element. Accordingly, if the breakdown of insulating film is to be avoided, the flattening of the interface between the polycrystalline silicon layer and the insulating film, in particular, projected portions of the polycrystalline silicon layer is indispensable.

Next, there will be explained about the surface features of the polycrystalline silicon layer in the case where an insulating film (oxide film) has been formed on the polycrystalline silicon layer by the conventional thermal oxidation.

FIG. 1 is a sectional TEM photograph illustrating the structure of an insulating film (oxide film) formed on the polycrystalline silicon layer by of the conventional thermal oxidation, and FIG. 2 is a schematical diagram of the sectional TEM photograph of FIG. 1.

Specifically, this structure was obtained by a process wherein a polycrystalline silicon layer 3 was deposited in advance via an insulating layer (oxide film layer) 2 on a Si substrate 1, and then, a thermal oxide film (dry oxide film) 4 is formed at a temperature of 900° C. on the polycrystalline silicon layer 3. As shown in FIG. 2, the curvature of the protruded tip end of polycrystalline silicon layer 3 was not substantially altered even after the oxidation thereof for forming the thermal oxide film 4, i.e. the recessed/projected configuration of the interface between the oxide film and the polycrystalline silicon layer is retained substantially the same as that prior to oxidation of the polycrystalline silicon layer 3. Namely, it is difficult, according to the conventional method of forming an oxide film by the thermal oxidation of polycrystalline silicon layer, to flatten the recessed/projected configuration of the interface between the oxide film and the polycrystalline silicon layer.

It is imperative, in order to further enhance the performance of semiconductor element, to minimize the recessed/projected configuration of the interface between the polycrystalline silicon layer and the oxide film formed thereon. As a countermeasure, the treatment of the polycrystalline silicon layer by CMP (Chemical Mechanical Polishing) or a solution of ammonium fluoride has been tried up to date. In the method using the CMP, though it is possible to physically flatten the surface of the polycrystalline silicon layer, it will lead to the introduction of crystal defects into the polycrystalline silicon layer during the CMP process, so that the influences on a resultant semiconductor element by the crystal defects would be unavoidable. In particular, if it is desired to realize the flattening of the order of several tens nanometers or less in surface roughness, since the magnitude of surface roughness is very small as compared with the inherent etching rate of the CMP, it is indispensable to optimize and closely control the conditions of the CMP. Therefore, the employment of the CMP for practical use is expected to be very difficult due to the problems such as high cost.

On the other hand, the treatment of the surface of polycrystalline silicon with a solution of ammonium fluoride is expected to invite an increased roughness of surface or an increase in magnitude of recess or projection due to the plane direction dependency of this etching solution. Further, even if the surface to be treated is formed of (111) plane, an inadvertent thinning of active layer will be unavoidably caused due to the etching by this etching solution. The polycrystalline silicon layer to be deposited on an insulating layer is frequently as thin as around sub-micrometers. If such a thin polycrystalline silicon layer is flattened, and then oxidized for forming an oxide layer, the thickness of the active layer may be decreased by a magnitude of the order of several tens nanometers due to the etching for this flattening by the etching solution and also due to this subsequent oxidation treatment. As a result, it may become difficult to secure a sufficient thickness of polycrystalline silicon which is required for the operation of semiconductor element. Additionally, since there is a possibility that the grain boundary of polycrystalline silicon may be selectively etched by the treatment using this etching solution, or that the polycrystalline silicon may be locally contaminated by the treatment using this etching solution, the employment of this ammonium fluoride solution for practical use is expected to be very difficult.

Moreover, the employment of the aforementioned CMP method or etching method inevitably invites an increase in number of manufacturing steps.

Namely, if the recessed/projected portion of the surface of polycrystalline silicon layer is to be reduced as minimum as possible by the aforementioned CMP method or etching method, additional steps may be required to be incorporated therein, thus necessitating an enormous time and labor for the development of the semiconductor element. As a matter of fact, if the aforementioned CMP method or etching method is to be employed for mass production, the reconsideration or replacement of manufacturing lines may be necessitated. Under the circumstances, it is now demanded to develop a technique for realizing a semiconductor element comprising a polycrystalline silicon layer having a minimal surface roughness, the technique being desirably featured in that it makes good use of the know-how of conventional manufacturing technique and manufacturing apparatus, that it is capable of achieving a high investment efficiency, and that it is possible to manufacture such a semiconductor element under an environment which is compatible with the conventional process of manufacturing a Si semiconductor device.

As explained above, in spite of the existing demand for the improvement in flatness of the interface between an insulating layer and a polycrystalline silicon layer of semiconductor element at the step of forming the insulating film on the polycrystalline silicon layer in the manufacture of a semiconductor device, no one has succeeded to provide a truly effective means up to date, so that there is urgent need now for the development of a technique for improving the flatness of the aforementioned interface.

BRIEF SUMMARY OF THE INVENTION

This invention has been accomplished under the aforementioned circumstances, and therefore, an object of this invention is to provide a method of manufacturing a semiconductor device, which is capable of directly forming an insulating layer on a semiconductor layer comprising a polycrystalline silicon, while making it possible to minimize the surface roughness of the semiconductor layer and hence to improve the surface flatness of the semiconductor layer.

Another object of this invention is to provide a semiconductor device comprising a semiconductor layer comprising a polycrystalline silicon layer, and an insulating layer formed directly on the semiconductor layer, wherein the semiconductor device is featured in that the surface roughness of the semiconductor layer is minimized, and hence the surface flatness of the semiconductor layer is improved.

According to one aspect of the present invention, there is provided a method of manufacturing a semiconductor device, comprising:

forming a semiconductor layer on a substrate, the semiconductor layer having an acute projection containing polycrystalline silicon; and forming an insulating layer on the semiconductor layer through an oxidation of the semiconductor layer by excited oxygen species in such a manner that a radius of curvature of the acute projection of the semiconductor layer becomes 20 nm or more.

According to another aspect of the present invention, there is also provided a semiconductor device, comprising:

a substrate;

a semiconductor layer comprising polycrystalline silicon and formed on the substrate; and an oxide layer formed directly on the semiconductor layer and through an oxidation of the semiconductor layer by excited oxygen species.

BRIEF DESCRIPTION OF THE SEVERAL VIEWS OF THE DRAWING

FIG. 2 is a cross-sectional view schematically illustrating the cross-section of an oxide film formed by the conventional thermal oxidation;

FIG. 3 is a graph illustrating the relationship between the film thickness of oxide film and the results of evaluation performed by AFM on the surface roughness of the semiconductor layer;

DETAILED DESCRIPTION OF THE INVENTION

Figure 1:
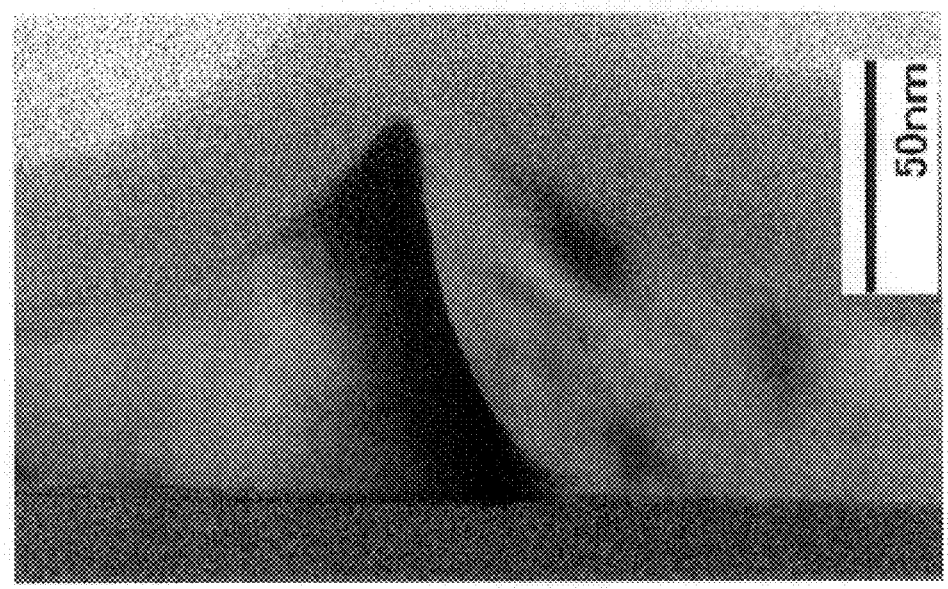
FIG. 1 is a sectional TEM photograph illustrating an oxide film formed by the conventional thermal oxidation.

According to the conventional method of oxidizing the surface of polycrystalline layer for forming an insulating layer, generally, a substrate is heated at a temperature of 900° C. for example while feeding oxygen gas over the substrate, thus forming the insulating layer. Although there is also known as an alternative method for forming an insulating layer to employ a deposition method by CVD method, the deposition method is accompanied with problems that the insulating layer to be formed will include a large quantity of impurities and structural defects. Therefore, in the manufacture of an element of the latest ULSI grade such as 1GDRAM, a heating method is usually adopted. A main reason for employing an insulating layer to be formed through a heating method simply resides in the fact that the structural defects at an interface of the insulating layer with an underlying polycrystalline layer as well as inside the insulating layer can be minimized, thereby making it possible to obtain a thin and densified insulating film. However, as already explained above, even if it is possible to reduce the density of structural defects inside the insulating film, the heating method is accompanied with the problem that the oxidation is proceeded in such a manner that the surface roughness of the polycrystalline silicon layer is apparently retained. Therefore, it is impossible, according to the conventional heating method of forming an insulating film, to suppress the deterioration in performance of the semiconductor element that may be induced by the surface roughness of polycrystalline silicon layer.

Meanwhile, it has been confirmed that when an insulating film is formed by radical oxidizing species, the radical oxidizing species functions to improve the flatness of the interface between the Si substrate and the insulating film. The function of this radical oxidizing species will be explained with reference to FIG. 3.

FIG. 3 shows the results wherein the surface roughness of Si substrate having an oxide film formed thereon by either the ordinary thermal (dry) oxidation or the radical oxidation is quantified by the AFM evaluation. The value at the point in the graph where the thickness of oxide film is "0" represents the surface roughness of the Si substrate immediately after the removal of native oxide film formed on the surface of the Si substrate. This value in the embodiment shown in FIG. 3 was 0.2 nm. In the evaluation of the roughness of the interface, oxide films differing in thickness were formed at first on the surface of the Si substrate by the individual process, and then, these oxide films were removed, after which the roughness of each interface of Si substrate was quantified by the AFM evaluation.

AS shown in the graph of FIG. 3, when an oxide film was formed by thermal oxidation, the surface roughness of the semiconductor layer was once increased, as compared with that prior to the oxidation, to some extent as a result of the thermal oxidation in proportion to an increase in thickness of the oxide film, after which the surface roughness was gradually decreased. Whereas, when an oxide film was formed by radical oxidation, the effect of reducing the surface roughness was admitted from the initial stage of oxidation, this effect being enhanced as the oxidation was continued to progress. It has been found from these results that the thermal oxidation is inappropriate for use where the flatness of the interface is required to be improved within a limited thickness of insulating film, and that the radical oxidation proceeds based on a peculiar oxidation mechanism which substantially differs from that of the thermal oxidation.

When an oxide layer having a thickness of about 23 nm was formed by the thermal oxidation, the surface roughness of the semiconductor layer was retained at Rms=0.18 nm or so. Whereas, in the case of the radical oxidation, even when an oxide layer having a thickness of as thin as 10 nm or so was formed, it was possible to control the surface roughness of the semiconductor layer to Rms=0.17 nm or so. In this invention, in order to suppress undesirable electric characteristics such as the deterioration of MOSFET mobility due to the scattering by the interface roughness, the surface roughness of the semiconductor layer should preferably be controlled to Rms=20 nm or less. Further, in order to further enhance the performance of MOSFET, the film thickness of the oxide film should preferably be as thin as possible, preferably be 1000 nm or less. In the case of typical MOSFET 0.1 micron rule, the film thickness of the oxide film should preferably be not more than 10 nm, more preferably not more than 3 nm. It is now made possible to simultaneously satisfy these demands by performing the oxidation of Si substrate by excited oxygen species.

The results shown FIG. 3 represent simply the situations where the flattening of Si wafer was intended on the occasion of forming an oxide film on the Si wafer. In the case of forming an oxide film on a polycrystalline silicon layer however, the crystal axes of the polycrystalline silicon layer frequently differ by an angle of several degrees or more depending on the grains of the polycrystalline silicon layer. Additionally, it is also conceivable that the oxidation may be accelerated in the vicinity of grain boundaries, and that the oxidation rate may be altered due to the effect of configuration of the projected portions. Therefore, the oxidation of the projected portions of polycrystalline silicon layer by excited oxygen species is assumed to be proceeded based on a different oxidation mechanism from that of the oxidation of the surface of Si substrate.

Next, specific examples of the present invention will be explained with reference to a case wherein an insulating layer is formed on the surface of polycrystalline silicon layer accompanied with surface roughness. This insulating layer, when used in a semiconductor device, is capable of functioning as a gate insulating layer, a capacitor insulating layer or an interlayer isolating layer of MISFET, etc.

As for the materials for the substrate used in the present invention, not only semiconductors such as Si, Ge and a mixed crystal thereof, but also a substrate which is relatively low in heat resistance may be employed. When a substrate formed of a material of relatively low softening point, e.g. not more than 1000° C., such as glass (about 500° C. in softening point), plastics (about 200° C. in softening point), polytetrafluoroethylene (about 80° C. in softening point), etc. is employed, the effects of the present invention will be more prominently manifested.

Incidentally, an insulating layer may be interposed between a substrate formed of any of aforementioned materials and a semiconductor layer comprising polycrystalline silicon.

The polycrystalline silicon can be formed by allowing a polycrystal to grow on an underlying amorphous layer. For example, the polycrystalline silicon can be formed by CVD method. Alternatively, a layer of amorphous silicon is formed in advance, and then, the amorphous silicon layer is heat-treated by laser annealing for instance to form the polycrystalline silicon.

A semiconductor layer comprising the polycrystalline silicon formed in this manner is inevitably accompanied with projected portions. The surface roughness in this case is in the range of 0.1 nm to 100 nm for instance, and a radius of curvature at an tip end of the projected portion is as sharp as 15 nm or less. When this semiconductor layer comprising the polycrystalline silicon is oxidized by excited oxygen species, this semiconductor layer is transformed into an oxide film (insulating film), and at the same time, a flattened surface is formed at this tip end of the projected portion.

The excited oxygen species can be produced by applying a microwave discharge to oxygen gas. Alternatively, a microwave discharge may be applied to a mixed gas comprising oxygen gas and inert gas so as to produce the excited oxygen species. Further, it is also possible to generate the excited oxygen species by remote plasma, RF plasma or laser beam. The excited oxygen species can be also produced from ozone.

The temperature for the radical oxidation may be selected within the range of from room temperature to about 1200° C., more preferably from 400 to 900° C. The room temperature in this case means a temperature ranging from 0° C. to 40° C. The pressure for the radical oxidation may be selected within the range of from 0.1 to 20 torr. The output of microwave may be typically selected within the range of from 10 to 1000 W or so.

The following reactions may be exemplified for obtaining an excited state.

$O_2$+excitation energy $(h\nu)=O(3P)+O(3P)$:5.06 to 5.26 eV  (1)

$O_2$+excitation energy $(h\nu)=O(3P)+O(1D)$:7.02 to 7.22 eV  (2)

$O_2$+excitation energy $(h\nu)=O(1D)+O(1D)$:8.98 to 9.18 eV  (3)

$O_2$+excitation energy $(h\nu)=O(3P)+O(1S)$:9.24 to 9.44 eV  (4)

If the reaction (1) which is the minimum in excitation energy among these reactions is adopted, the effect of flattening the projected portions of the polycrystalline silicon layer can be obtained. Further, if radical oxygen exhibiting a higher excitation energy state is employed, the effect of flattening the projected portions of the polycrystalline silicon layer would be further enhanced.

In the step of forming the insulating layer, it is also possible to simultaneously feed at least one kind of elements selected from the group consisting of nitrogen, Zr, Hf, La, Ti, Ta, Pr, Ba, Sr and Al, in addition to the aforementioned excited oxygen species. Nitrogen may be added to the reaction system as an excited nitrogen species. Other elements such as Zr, Hf, La, Ti, Ta, Pr, Ba, Sr and Al may be added to the reaction system as a vapor phase as represented by CVD method, as a molecule which can be decomposed on the surface of sample, or as a simple atom as represented by sputtering method or MBE method. In any of these cases, not only oxygen, but also at least one kind of elements selected from the group consisting of Si, nitrogen, Zr, Hf, La, Ti, Ta, Pr, Ba, Sr and Al will be incorporated into the resultant insulating layer. In particular, when oxygen or nitrogen among these elements is incorporated into the insulating layer, the quality of the insulating layer can be improved, thereby making it possible to obtain a semiconductor device exhibiting excellent electric properties.

Figure 4:
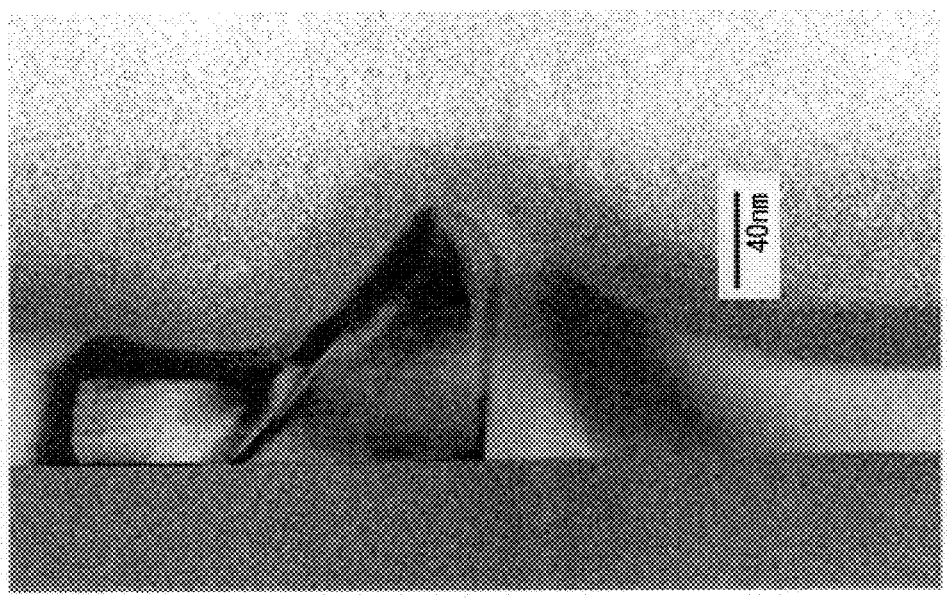
FIG. 4 is a sectional TEM photograph illustrating an oxide film formed through a radical oxidation according to one embodiment of the present invention.
Figure 5:
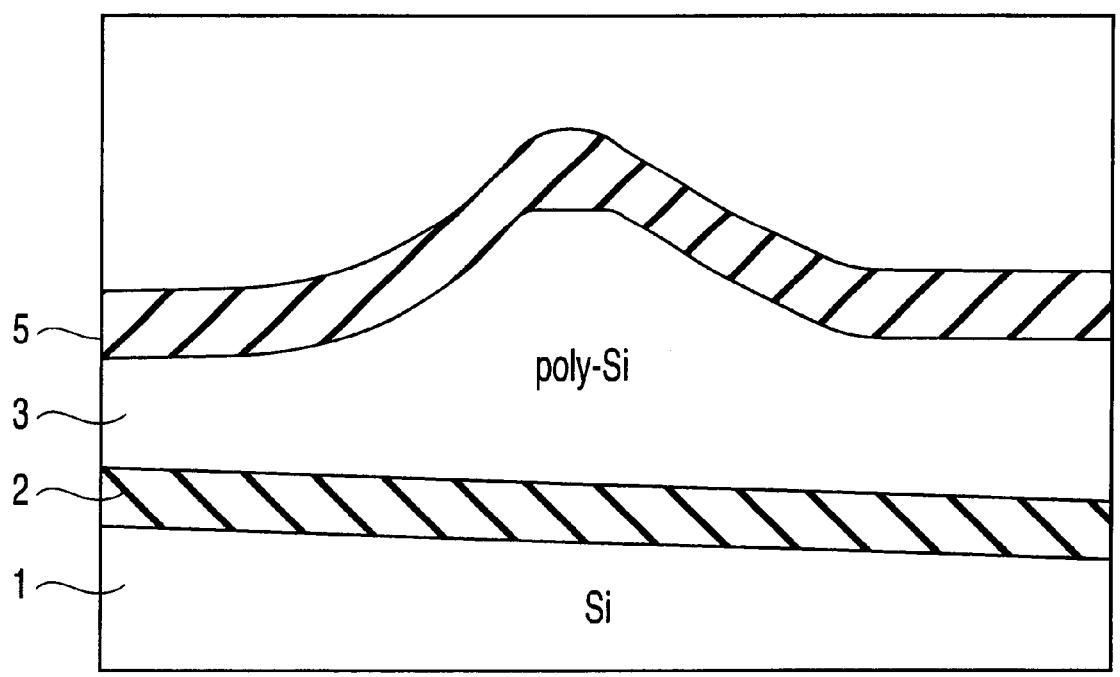
FIG. 5 is a cross-sectional view schematically illustrating an oxide film formed through a radical oxidation according to one embodiment of the present invention.

FIG. 4 is a sectional TEM photograph illustrating an oxide film formed on the surface of polycrystalline silicon layer by radical oxidation, and FIG. 5 is a cross-sectional view schematically illustrating the resultant oxide film.

As shown in FIG. 5, an insulating layer (oxide film layer) 2, a polycrystalline silicon layer 3 and an oxide film 5 produced through a radical oxidation are successively deposited on the surface of a Si substrate 1. This radical oxide film 5 was formed by oxidizing the surface of the polycrystalline silicon layer 3 by oxygen gas containing radical oxygen which was supplied from a radicals-generating source utilizing microwave excitation under the conditions of 900° C. in radical oxidation temperature and 5 torr in oxygen pressure at the surface of substrate being oxidized.

As seen from the photograph shown in FIG. 4 as well as from the cross-sectional view shown in FIG. 5, the tip end of the projected portion of the surface of the polycrystalline silicon layer 3 is flattened due to the flattening effect by the radical oxidation, thereby forming a flattened surface of the order of atoms. This flattened surface is not parallel with the surface of the Si substrate 1, indicating that this flattened surface was formed depending on the crystal orientation of crystal grain. Further, it is also shown in these FIGS. that a right shoulder portion of the top of projected portion, which corresponds to a grain boundary, is also flattened depending on the crystal orientation of crystal grain located on the right side. Meanwhile, it has been made clear that the effect of the radical oxidation to accelerate the oxidation at the grain boundary portion that may be observed at a central portion of the projected portion is minimal, and that there is a little possibility that the grain boundary portion that has undergone the oxidation thereof becomes a recessed portion that may newly give rise to the concentration of electric field. Namely, it has been made clear for the first time that when an oxide film is formed on a polycrystalline silicon layer by a radical oxidation of the surface of the polycrystalline silicon layer, the oxidation does not proceed preferentially in the direction perpendicular to the Si substrate, but proceeds depending on the crystal orientation of the layer being oxidized, and the oxidation proceeds without inviting an accelerated oxidation at the grain boundary.

Since an insulating layer is formed on a semiconductor layer by excited oxygen species in this semiconductor device according to one embodiment of this invention, the surface configuration of semiconductor layer located at an interface between this semiconductor layer and the insulating layer can be improved. Namely, a radius of curvature at the tip end of the recessed/projected surface of semiconductor layer is 20 nm or more, and a flat lattice plane 10 nm or more in width and 1 nm to 10 nm in surface roughness is formed on the projected portion. This semiconductor layer comprises crystal grains which enable the angle between the flat surface of the semiconductor layer and the surface of substrate to be confined within the range of 0.1 to 20 degrees, preferable angles thereof being 10 degrees or less. Further, the density of structural defects of the interface, in other words, the interfacial level density of the interface between the semiconductor layer and the insulating layer is confined to $10^{11} cm^{-2} eV^{-1}$ or less.

It will be seen from this value of interfacial level density that the oxidation was proceeded ideally due to the employment of the excited oxygen species.

These preferable results are achieved solely due to the employment of the radical oxidation. In other words, it would be impossible to achieve these results by the employment of the conventional thermal oxidation. For example, when the interfacial level density of the interface between the insulating layer formed by thermal oxidation and the semiconductor layer was compared with the interfacial level density of the interface which was manufactured by the radical oxidation, the former sample indicated a value of $6 \times 10^{10} cm^{-2} eV^{-1}$, whereas the latter sample indicated a value of $2 \times 10^{10} cm^{-2} eV^{-1}$. The value of interfacial level density is very delicate and tends to vary, so that this value will be easily varied depending on various parameters such as the size and operating conditions of semiconductor element, the conditions for forming the polysilicon (temperature, annealing time, atmosphere, etc.), etc. However, it was confirmed that the employment of the radical oxidation was effective in improving the aforementioned features as compared with the thermal oxidation irrespective of these parameters, this trend being scarcely reversed.

In the case of thermal oxidation as represented by the dry oxidation, heated oxygen reaches the interface of oxide layer/Si substrate according to a thermal gradient which is perpendicular to the aforementioned interface, thereby oxidizing the Si located at the interface. Therefore, the oxidation is considered to proceed at the interface accompanied with a surface roughness without changing the features of the surface roughness. On the other hand, in the case of radical oxidation by excited oxygen species, the oxygen species itself has a high energy in addition to the energy given thereto by heating. Therefore, when this excited oxygen species is moved toward the interface while diffusing through oxide layer and reaches the interface accompanied with a surface roughness (projected portions), the oxidation is enabled to proceed also in the direction parallel with the interface on account of the higher energy of the excited oxygen species than that of the oxidation species of dry oxidation. As a result, the surface flattening is assumed to be promoted.

As explained above, it is now possible, according to this invention, to improve the quality of the oxide layer formed on a polycrystalline silicon layer as compared with the oxide layer to be produced by the conventional method. As a result, it is possible to realize the improvement in quality of semiconductor elements to be produced on the surface of polycrystalline silicon layer. Additionally, any changes in the manufacturing process of semiconductor device can be dealt with by simply substituting the radical oxidation device for the conventional oxidation device, thereby making it possible to minimize any changes required of process line.

As explained in detail, it is possible, according to this invention, to provide a method of manufacturing a semiconductor device, which is capable of directly forming an insulating layer on a semiconductor layer comprising a polycrystalline silicon, while making it possible to minimize the surface roughness of the semiconductor layer and hence to improve the surface flatness of the semiconductor layer. Further, according to this invention, such an excellent insulating layer as mentioned above can be formed at a low temperature.

Further, it is also possible, according to this invention, to provide a semiconductor device comprising a semiconductor layer comprising a polycrystalline silicon layer, and an insulating layer formed directly on the semiconductor layer, wherein said semiconductor device is featured in that the surface roughness of the semiconductor layer is minimized, and hence the surface flatness of the semiconductor layer is improved.

The employment of this invention will make it possible to improve the flatness of the interface between a semiconductor layer having a polycrystalline silicon layer on the surface thereof and an insulating layer formed on this polycrystalline silicon layer within a limited range of thickness of the insulating film. Additionally, this invention can be practiced without accompanying any fundamental changes in the conventional process, thereby making it possible to minimize any increase in the manufacturing cost of semiconductor device.

Therefore, it is now possible to obtain a semiconductor element having an insulating layer of higher performance as compared with the conventional insulating layer, in particular, to obtain a semiconductor element which is improved in dielectric breakdown characteristics, and hence this invention will be very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming a semiconductor layer on a substrate, said semiconductor layer having an acute projection containing polycrystalline silicon; and
   forming an insulating layer on said semiconductor layer through an oxidation of said semiconductor layer by excited oxygen species in such a manner that a radius of curvature of said acute projection of said semiconductor layer becomes 20 nm or more.

2. The method according to claim 1, wherein said polycrystalline silicon is formed by enabling said polycrystalline silicon to be formed on an underlying amorphous layer.

3. The method according to claim 2, wherein said polycrystalline silicon is formed by CVD method.

4. The method according to claim 2, wherein said polycrystalline silicon is formed by a process wherein an amorphous silicon is formed at first, and then, the surface of said amorphous silicon is thermally treated to form said polycrystalline silicon.

5. The method according to claim 1, wherein said insulating layer is formed by feeding, together with said excited oxygen species, at least one kind of elements selected from the group consisting of nitrogen, Zr, Hf, La, Ti, Ta, Pr, Ba, Sr and Al.

6. The method according to claim 1, wherein said substrate mainly comprising a material having a softening point of 1000° C. or less.

7. The method according to claim 6, wherein said substrate is formed of glass, plastics or polytetrafluoroethylene.

8. The method according to claim 1, wherein said excited oxygen species is generated by through an application of a microwave discharge to an oxygen gas, or through an application of a microwave discharge to a mixed gas comprising an oxygen gas and an inert gas, a remote plasma, an RF plasma, laser beam or ozone.

9. The method according to claim 8, wherein the formation of said insulating film is performed under the conditions, wherein the temperature is confined within the range of from room temperature to 1200° C., the pressure is confined within the range of from 0.1 to 20 torr, and the output of microwave is confined within the range of from 10 to 1000 W.

10. The method according to claim 8, wherein the formation of said insulating film is performed under the conditions, wherein the temperature is confined within the range of from 400° C. to 900° C., the pressure is 5 torr, and the output of microwave is 100 W.

11. The method according to claim 1, wherein said excited oxygen species comprises oxygen of ground state.

12. The method according to claim 11, wherein said excited oxygen species comprises an excited species having an excited energy of 5.16 eV or more.

13. The method according to claim 1, wherein an interfacial level density between said semiconductor layer and said insulating layer formed on said semiconductor layer is $10^{11}$ cm$^{-2}$ eV$^{-1}$ or less.

14. The method according to claim 1, wherein a tip end of said projection of semiconductor layer has a radius of curvature of 20 nm or more and also a flat lattice plane 10 nm or more in width and 1 nm to 10 nm in surface roughness.

15. The method according to claim 1, wherein said insulating layer has a thickness of 1000 nm or less, and a surface roughness of the interface between said insulating layer and said semiconductor layer is: Rms=20 nm or less.

* * * * *